(12) United States Patent
Ruan et al.

(10) Patent No.: US 11,876,086 B2
(45) Date of Patent: Jan. 16, 2024

(54) DISPLAY PANEL (71) Applicant: Au Optronics Corporation, Hsinchu (TW)

(72) Inventors: Cheng-He Ruan, Hsinchu (TW);
Jian-Jhou Tseng, Hsinchu (TW);
Chih-Yuan Hou, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 208 days.

(21) Appl. No.: 17/515,562

(22) Filed: Nov. 1, 2021

(65) Prior Publication Data

US 2022/0302174 A1 Sep. 22, 2022

(30) Foreign Application Priority Data

Mar. 22, 2021 (TW) .................................. 110110174

(51) Int. Cl.
*H01L 25/16* (2023.01)
*H01L 23/00* (2006.01)
*H01L 27/12* (2006.01)

(52) U.S. Cl.
CPC ............ *H01L 25/167* (2013.01); *H01L 24/06* (2013.01); *H01L 27/124* (2013.01); *H01L 2224/0616* (2013.01)

(58) Field of Classification Search
CPC . H01L 25/167; H01L 23/528; H01L 23/5286; H01L 23/5386; H01L 25/0753; H01L 27/124; H01L 27/156; H01L 21/76894; H01L 24/06
See application file for complete search history.

(56) References Cited

U.S. PATENT DOCUMENTS

2020/0035750 A1 1/2020 Li
2020/0152827 A1* 5/2020 Chen .................. H01L 33/0095

FOREIGN PATENT DOCUMENTS

CN 107507926 12/2017
CN 109003996 12/2018

* cited by examiner

*Primary Examiner* — Peter M Albrecht
(74) *Attorney, Agent, or Firm* — JCIPRNET (57) ABSTRACT

A display panel includes a substrate and display pixels. The display pixels are disposed on the substrate, and each of the display pixels includes pad sets, light-emitting devices, a first connecting wire, a second connecting wire, and first cutting regions. Each pad set has a first pad and a second pad. The light-emitting devices are electrically bonded to at least part of the pad sets. The first connecting wire is electrically connected to the first pads of a plurality of first pad sets of the pad sets. The second connecting wire is electrically connected to the second pads of the pad sets. The first cutting regions are disposed on one side of each of the first pad sets. Two first connecting portions of the first connecting wire and the second connecting wire connecting each of the first pad sets are located in one of the first cutting regions.

11 Claims, 11 Drawing Sheets

DISPLAY PANEL

CROSS-REFERENCE TO RELATED APPLICATION

This application claims the priority benefit of Taiwan application serial no. 110110174, filed on Mar. 22, 2021. The entirety of the above-mentioned patent application is hereby incorporated by reference herein and made a part of this specification.

BACKGROUND

Technical Field

The disclosure relates to a display panel, and in particular, relates to a display panel exhibiting a favorable repair yield.

Description of Related Art

In recent years, micro light-emitting diodes (micro-LEDs) are gradually gaining popularity due to their advantages when being applied in panels such as easy color adjustment, long light-emitting life, and no image burn-in.

However, as the resolution of the display panels continues to increase, the sizes and gaps of the pads configured to be bonded to the micro light-emitting diodes have decreased. Further, the number of crystal grain transfers of a single panel has also increased significantly, so the difficulty of crystal grain transfer has increased considerably. Therefore, development of a pixel structure that is easy to be repaired so as to increase the repair yield of high-resolution display panels is an important issue.

SUMMARY

The disclosure provides a display panel exhibiting a favorable production yield.

The disclosure provides a display panel including a substrate and a plurality of display pixels. The display pixels are disposed on the substrate, and each of the display pixels includes a plurality of pad sets, a plurality of light-emitting devices, a first connecting wire, a second connecting wire, and a plurality of first cutting regions. Each of the pad sets has a first pad and a second pad. The light-emitting devices are electrically bonded to at least part of the pad sets. The first connecting wire is electrically connected to the first pads of a plurality of first pad sets of the pad sets. The second connecting wire is electrically connected to the second pads of the pad sets. The first cutting regions are disposed on one side of each of the first pad sets. Two first connecting portions of the first connecting wire and the second connecting wire connecting each of the first pad sets are located in one of the first cutting regions.

In an embodiment of the disclosure, the display panel further includes a plurality of active devices electrically connected to the first pads of the pad sets. The pad sets include: a first pad set and a second pad set electrically connected to one of the active devices. A gap between the first pad of the first pad set and the first pad of the second pad set in a first arrangement direction is less than or equal to a gap between the first pad and the second pad in each of the first pad set and the second pad set in a second arrangement direction. The first arrangement direction intersects the second arrangement direction.

In an embodiment of the disclosure, the display panel further includes a plurality of active devices electrically connected to the first pads of the pad sets. These pad sets further include a plurality of second pad sets. The first pad sets are electrically connected to a first active device of the active devices, and the second pad sets are electrically connected to a second active device of the active devices. Further, a number of the first pad sets is different from a number of the second pad sets.

In an embodiment of the disclosure, in the display panel, the first pad sets are configured to be electrically bonded to at least one first light-emitting device of the light-emitting devices, and the second pad sets are configured to be electrically bonded to at least one second light-emitting device of the light-emitting devices. Further, a light-emitting color of the at least one first light-emitting device is different from a light-emitting color of the at least one second light-emitting device.

In an embodiment of the disclosure, in the display panel, the light-emitting color of the at least one first light-emitting device is red, and the light-emitting color of the at least one second light-emitting device is green or blue. Further, the number of the first pad sets is greater than the number of the second pad sets.

In an embodiment of the disclosure, in the display panel, an arrangement direction of the first pad and the second pad in each of the first pad sets is different from an arrangement direction of the first pad and the second pad in each of the second pad sets.

In an embodiment of the disclosure, the display panel further includes another first connecting wire and a plurality of second cutting regions. The another first connecting wire is electrically connected to the first pads in the second pad sets. The second cutting regions are disposed on one side of each of the second pad sets. Two second connecting portions of the another first connecting wire and the second connecting wire connecting each of the second pad sets are located in one of the second cutting regions. Further, an arrangement direction of the first cutting regions intersects an arrangement direction of the second cutting regions.

In an embodiment of the disclosure, in the display panel, the light-emitting devices are flip-chip type light-emitting diodes.

In an embodiment of the disclosure, in the display panel, a vertical projection of the first connecting wire on the substrate does not overlap a vertical protection of the second connecting wire on the substrate.

In an embodiment of the disclosure, in the display panel, an arrangement direction of each of the first cutting regions and the corresponding one among the first pad sets intersects an arrangement direction of the first pad and the second pad of the corresponding first pad set.

In an embodiment of the disclosure, in the display panel, the first connecting wire and the second connecting wire belong to different film layers.

To sum up, in the display panel provided by an embodiment of the disclosure, the first connecting wire and the second connecting wire are respectively connected to the first pad and the second pad of the corresponding pad set through the two connecting portions in the cutting region disposed on one side of the corresponding pad set. As the two connecting portions are disposed in the same cutting region, the repair time of the display panel may be significantly shortened, the repair yield may be increased, and the overall production yield of the display panel may be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The terms used herein such as "about", "approximate", "essentially", or "substantial" include a related value and an average within an acceptable deviation range of specific values determined by a person having ordinary skill in the art with consideration of discussed measurement and a specific number of errors related to the measurement (i.e., the limit of the measurement system). For example, "about" may mean within one or more standard deviations, or within, for example, ±30%, ±20%, ±15%, ±10%, ±5% of the stated value. Moreover, a relatively acceptable range of deviation or standard deviation may be chosen for the term "about", "approximately", "essentially", or "substantially" as used herein based on measurement properties, cutting properties, or other properties, instead of applying one standard deviation across all the properties.

In the accompanying drawings, thicknesses of layers, films, panels, regions, and so on are exaggerated for clarity. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected (or coupled). Therefore, the electrical connection between two devices may include intervening elements existing between the two devices.

Descriptions of the disclosure are given with reference to the exemplary embodiments illustrated by the accompanying drawings in detail. Wherever possible, the same reference numbers are used in the drawings and the description to refer to the same or like parts.

Figure 1:
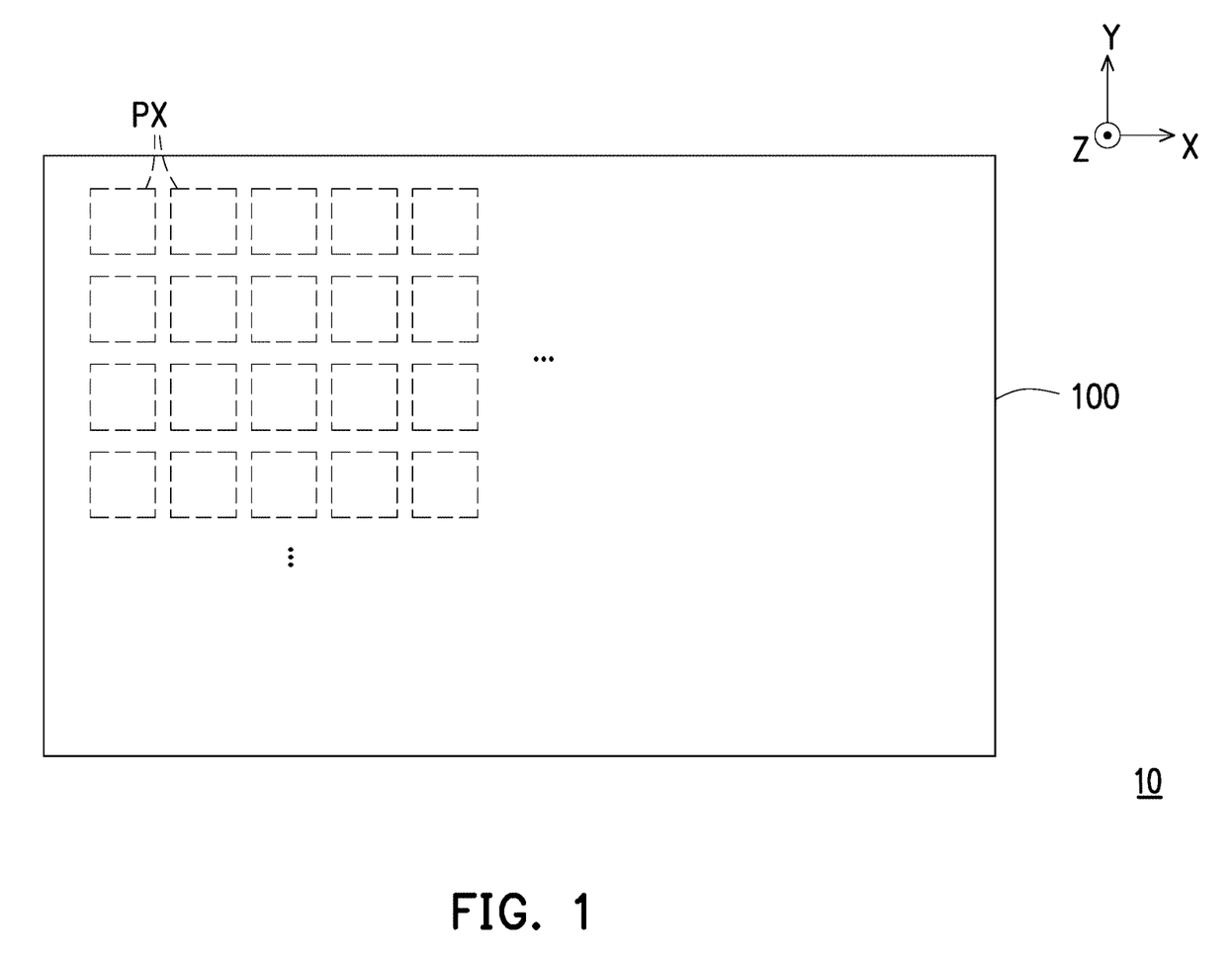
FIG. 1 is a schematic top view of a display panel according to a first embodiment of the disclosure.
Figure 2:
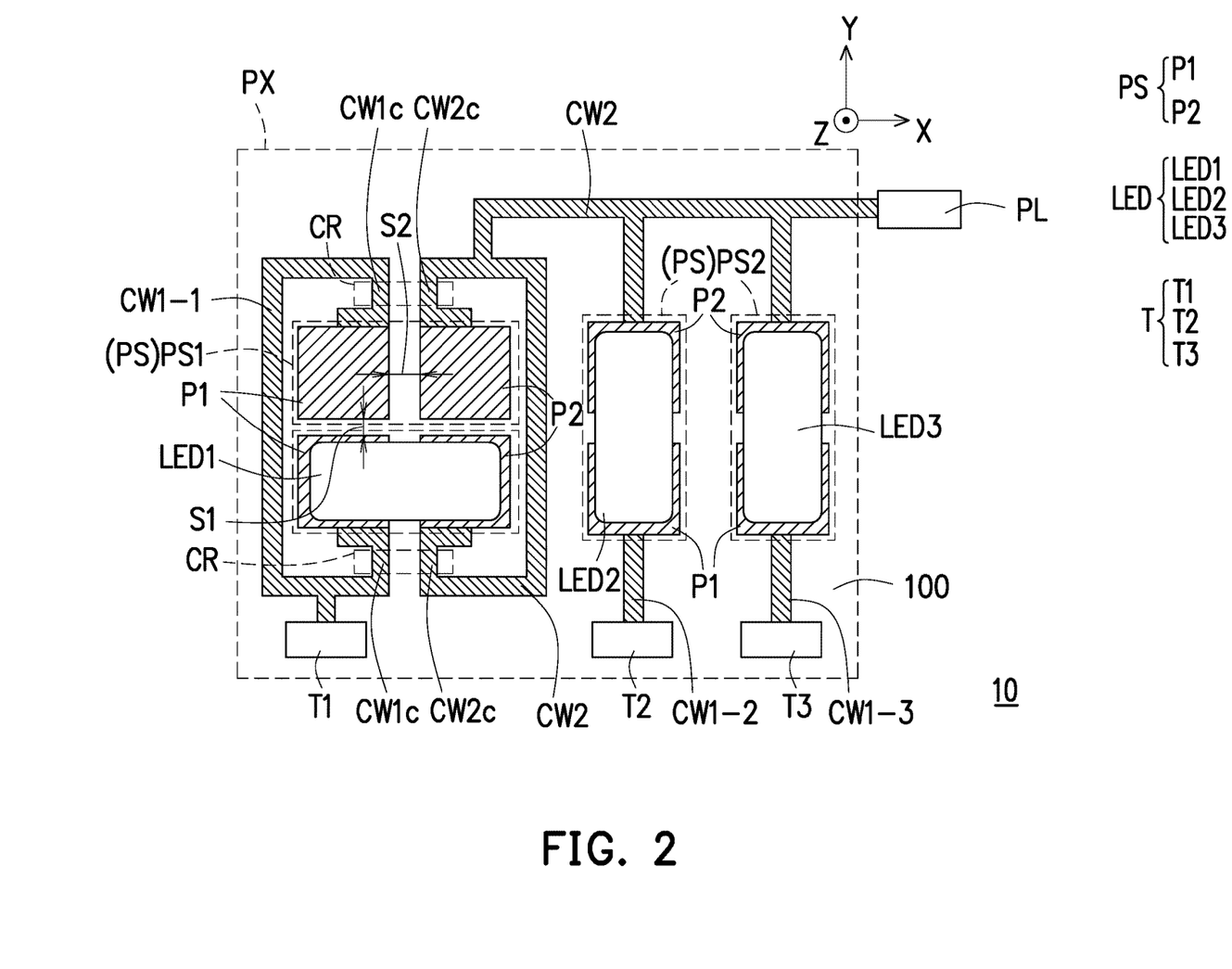
FIG. 2 is a schematic diagram of a display pixel of FIG. 1.
Figure 3:
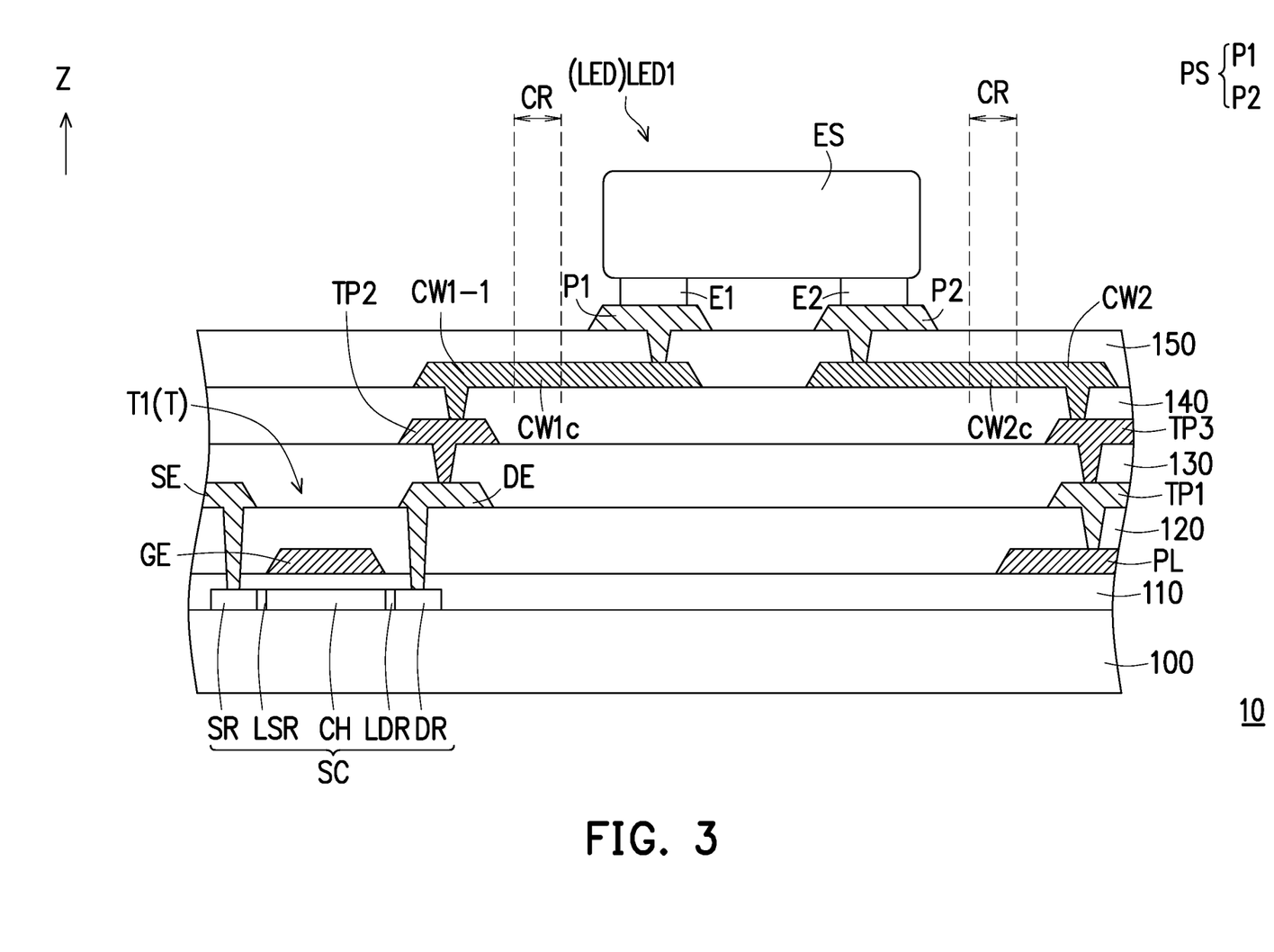
FIG. 3 is a cross-sectional schematic view of the display panel of FIG. 1.
Figure 4:
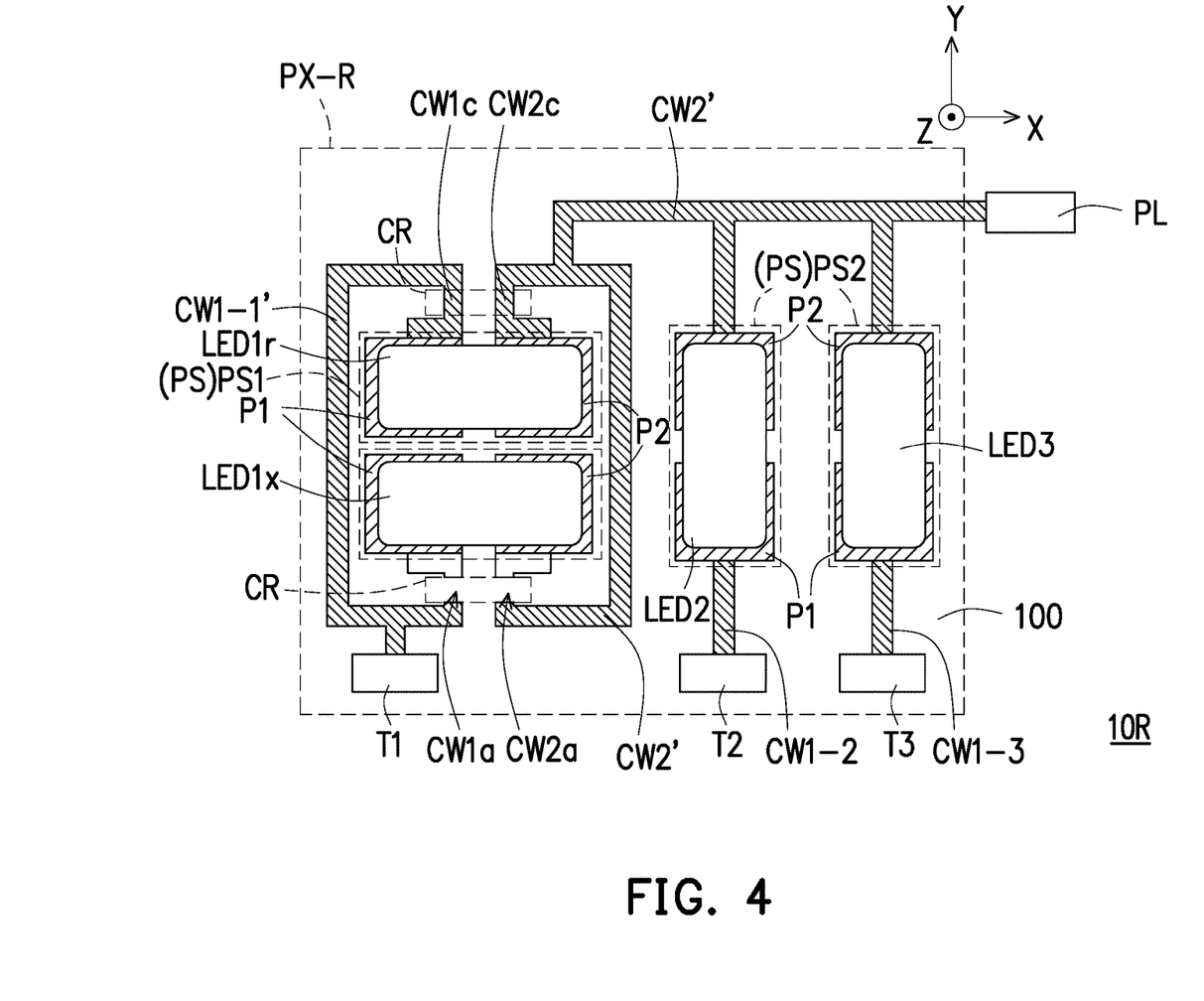
FIG. 4 is a schematic top view of the display pixel of FIG. 2 after being repaired.

FIG. 1 is a schematic top view of a display panel according to a first embodiment of the disclosure. FIG. 2 is a schematic diagram of a display pixel of FIG. 1. FIG. 3 is a cross-sectional schematic view of the display panel of FIG. 1. FIG. 4 is a schematic top view of the display pixel of FIG. 2 after being repaired.

With reference to FIG. 1 to FIG. 3, a display panel 10 includes a substrate 100 and a plurality of display pixels PX. The display pixels PX are disposed on the substrate 100. In this embodiment, the display pixels PX are arranged in an array. For instance, the display pixels PX are arranged in a plurality of rows and a plurality of columns in a direction X and a direction Y, but are not limited thereto. On the other hand, the display panel 10 may further include a plurality of signal lines electrically connected to the display pixels PX, such as a plurality of data lines (not shown), a plurality of scan lines (not shown), and a plurality of power lines PL. At least one data line, at least one scan line, and at least one power line corresponding to each of the display pixels PX are electrically connected, so as to receive a plurality of types of driving signals required by image displaying.

The display pixels PX includes a plurality of pad sets PS and a plurality of light-emitting devices LED. The pad sets PS are configured to be bonded to the light-emitting devices LED. In this embodiment, the pad sets PS of the display pixels PX may be divided into two parts, which are a plurality of pad sets PS1 and a plurality of pad sets PS2, and an arrangement direction (e.g., direction Y) of the pad sets PS1 is different from an arrangement direction (e.g., direction X) of the pad sets PS2. For instance, the pad sets PS1 are configured to be electrically bonded to a light-emitting device LED1, and the pad sets PS2 are configured to be electrically bonded to a light-emitting device LED2 or a light-emitting device LED3. Herein, light-emitting colors of the light-emitting device LED1, the light-emitting device LED2, and the light-emitting device LED3 are different from one another and may respectively be, for example, red, green, and blue, but are not limited thereto. In this embodiment, the light-emitting devices LED are, for example, flip-chip type light-emitting diodes. That is, each of the light-emitting devices LED may include an epitaxial structure layer ES, a first electrode E1, and a second electrode E2, and the first electrode E1 and the second electrode E2 are located on a same side of the epitaxial structure layer ES. The first electrode E1 and the second electrode E2 respectively are an anode and a cathode, for example.

Note that in this embodiment, in each of the display pixels PX, a number (e.g., two) of the pad sets PS1 configured to be bonded to the light-emitting device LED1 is greater than a number (e.g., one) of the pad sets PS2 configured to be bonded to the light-emitting device LED2 or the light-emitting device LED3. For instance, the probability of damage of the light-emitting device LED1 is greater than that of the light-emitting device LED2 and the light-emitting device LED3, and therefore, additional pad sets PS1 may be arranged for repair, and the probability of the display panel being scrapped due to failure of being enabled of a few light-emitting devices LED may thus be lowered. That is, the pad set PS1 on the upper left side of FIG. 2 may be used as a pad set for repair, so as to be electrically bonded to a light-emitting device LED1r (as shown in FIG. 4) for repair. It should be understood that, in other embodiments, the numbers of the pad sets PS1 and the pad sets PS2 may be adjusted according to actual product design or process risks to meet different repair requirements.

The pad sets PS includes first pads P1 and second pads P2. In this embodiment, the arrangement direction (e.g., direction X) of the first pads P1 and the second pads P2 of the pad sets PS1 is different from the arrangement direction (e.g., direction Y) of the first pads P1 and the second pads P2 of the pad sets PS2. Note that a gap S1 between two pad sets PS1 configured to be bonded to the light-emitting device LED1 in the arrangement direction (e.g., direction Y) is less than or equal to a gap S2 between the first pad P1 and the second pad P2 in each of the pad sets PS1 in the arrangement direction (e.g., direction X). In this way, the risk of short circuit between the first pads P1 and the second pads P2 of the pad sets PS1 due to alignment errors or/and solder overflow during the transposition and bonding process of the light-emitting device LED1 may be reduced.

Further, the display pixels PX also include a plurality of active devices T, a plurality of first connecting wires, and a second connecting wire CW2. In this embodiment, the active devices T are a first active device T1, a second active device T2, and a third active device T3, and the first connecting wires are a first connecting wire CW1-1, a first connecting wire CW1-2, and a first connecting wire CW1-3. The plural pad sets PS1 configured to be bonded to the light-emitting device LED1 are electrically connected to the first active device T1 through the first connecting wire CW1-1. The pad set PS2 configured to be bonded to the light-emitting device LED2 is electrically connected to the second active device T2 through the first connecting wire CW1-1. Another pad set PS2 configured to be bonded to the light-emitting device LED3 is electrically connected to the third active device T3 through the first connecting wire CW1-3. These pad sets PS are all electrically connected to one power line PL through the second connecting wire CW2. For instance, the first pads P1 and the second pads P2 of the pad sets PS are respectively configured to be bonded to the anodes (i.e., first electrodes E1) and the cathodes (i.e., second electrodes E2) of the light-emitting devices LED. These active devices T may be coupled to a system high voltage (OVDD), and the power lines PL may be coupled to a system low voltage (OVSS), but are not limited thereto.

Note that the display pixels PX further comprise a plurality of cutting regions CR, and these cutting regions CR are adjacent to one side of each of the pad sets PS1. Two connecting portions CW1c and CW2c of the first connecting wire CW1-1 and the second connecting wire CW2 connecting each of the first pad sets PS1 are both located in the corresponding cutting regions CR. More specifically, the arrangement direction (e.g., direction Y) of the cutting regions CR and the corresponding pad sets PS1 intersects the arrangement direction (e.g., direction X) of the first pads P1 and the second pads P2 in these corresponding pad sets PS1.

With reference to FIG. 4 together, for instance, when the light-emitting device LED1 bonded to the pad set PS1 on the lower left side of FIG. 2 is detected as an abnormal light-emitting device LED1x in a subsequent process, the pad set PS1 on the upper left side of FIG. 2 may be used to bond the light-emitting device LED1r for repair. After the light-emitting device LED1r for repair is bonded to the pad set PS1 for repair, a cutting step is performed, so as to remove the two connecting portions CW1c and CW2c of the first connecting wire CW1-1 and the second connecting wire CW2 located in the cutting region CR on a lower side of the abnormal light-emitting device LED1x. In other words, in a repaired display panel 10R, a first connecting wire CW1-1' and a second connecting wire CW2' of a display pixel PX-R respectively have a disconnection CW1a and a disconnection CW2a in the cutting region CR where the cutting step is performed, and in this way, the abnormal light-emitting device LED1x is electrically insulated from the two connecting wires.

Nevertheless, the disclosure should not be construed as limited thereto. In other embodiments, the cutting step of the two connecting wires may also be completed before the light-emitting device LED1r for repair is bonded to the pad set PS1, and a repairing process may optionally include a step of removing the light-emitting device LED1x. In this embodiment, removal of the connecting portions of the connecting wires may be implemented through a laser cutting process. Areas of vertical projections of the cutting regions CR on the substrate 100 are, for example, in a range between 140 μm² and 350 μm², but are not limited thereto. In other embodiments, the cutting regions may also cover one of the first connecting wire CW1-1' and the second connecting wire CW2' only. That is, only one connecting wire is cut. Therefore, the areas of the vertical projections of the cutting regions on the substrate 100 are, for example, in a range between 49 μm² and 100 μm².

In particular, by arranging the connecting portion CW1c of the first connecting wire CW1-1 and the connecting portion CW2c of the second connecting wire CW2 in the same cutting region CR, the number of cuts required may be significantly lowered, and repair time is thus shortened. Therefore, a repair yield and an overall production yield of the display panel may be improved.

Further, a method of forming the active devices T may include the following steps. A semiconductor pattern SC, a gate insulating layer 110, a gate GE, an interlayer insulating layer 120, a source SE, and a drain DE are sequentially formed on the substrate 100. The semiconductor pattern SC has a channel region CH, a source region SR and a drain region DR located on opposite sides of the channel region CH, a lightly-doped source region LSR connected between the channel region CH and the source region SR, and a lightly-doped drain region LDR connected between the channel region CH and the drain region DR. Further, the source SE and the drain DE penetrate the gate insulating layer 110 and the interlayer insulating layer 120 to be electrically connected to the source region SR and the drain region DR of the semiconductor pattern SC, respectively. In this embodiment, the power line PL and the gate GE may optionally belong to a same film layer. That is, the power line PL and the gate GE of the active device T may be formed of a same material in a same process (e.g., a lithography process), but are not limited thereto.

In this embodiment, the gate GE of the active device T may be optionally arranged above the semiconductor pattern SC to form a top-gate thin film transistor (TFT), which should however not be construed as a limitation in the disclosure. According to other embodiments, the gate GE of the active device T may also be arranged below the semiconductor pattern SC to form a bottom-gate TFT. On the other hand, a material of the semiconductor pattern SC is, for example, a polysilicon material. That is, the active device T is, for example, a low temperature poly-silicon thin film transistor (LIPS TFT). Nevertheless, the disclosure should not be construed as limited thereto. In other embodiments, the active device may also be an amorphous silicon TFT (a-Si TFT), a micro-Si TFT, or a metal oxide transistor.

Note that the semiconductor pattern SC, the gate insulating layer 110, the gate GE, the interlayer insulating layer 120, the source SE, and the drain DE may be applied to any semiconductor pattern, any gate insulating layer, any gate, any interlayer insulating layer, any source, and any drain of a display panel known to a person having ordinary skill in the art to be implemented. Further, the semiconductor pattern SC, the gate insulating layer 110, the gate GE, the interlayer insulating layer 120, the source SE, and the drain DE may be formed by any method known to a person having ordinary skill in the art, so description thereof is not provided herein.

On the other hand, the display panel 10 further includes a plurality of planarization layers 130, 140, and 150 and a plurality of transfer patterns TP1, TP2, and TP3. For instance, the planarization layer 130 and the planarization layer 140 are disposed between the active device T and the first connecting wire CW1-1 (or the second connecting wire CW2), and the planarization layer 150 is disposed between the pad set PS and the first connecting wire CW1-1 (or the second connecting wire CW2). The first connecting wire CW1-1 is electrically connected to the drain DE of the active device T through the transfer pattern TP2. The second connecting wire CW2 is electrically connected to the power line PL through the transfer pattern TP1 and the transfer pattern TP3. The first pad P1 and the second pad P2 of the pad set PS penetrate the planarization layer 150 to be electrically connected to the first connecting wire CW1-1 and the second connecting wire CW2, respectively.

Note that in this embodiment, the first connecting wires CW1-1, CW1-2, and CW1-3 and the second connecting wire CW2 may be optionally belong to the same film layer. Therefore, a vertical projection of each of the first connecting wires on the substrate 100 does not overlap a vertical protection of the second connecting wire CW2 on the substrate 100. That is, the first connecting wires CW1-1, CW1-2, and CW1-3 do not overlap the second connecting wire CW2 in a direction Z.

Some other embodiments are listed below to illustrate the disclosure in detail. Identical reference numerals are used to represent identical components, and descriptions of identical technical contents are omitted. For the omitted parts, description thereof may be found with reference to the foregoing embodiments, which is described in detail below.

Figure 5:
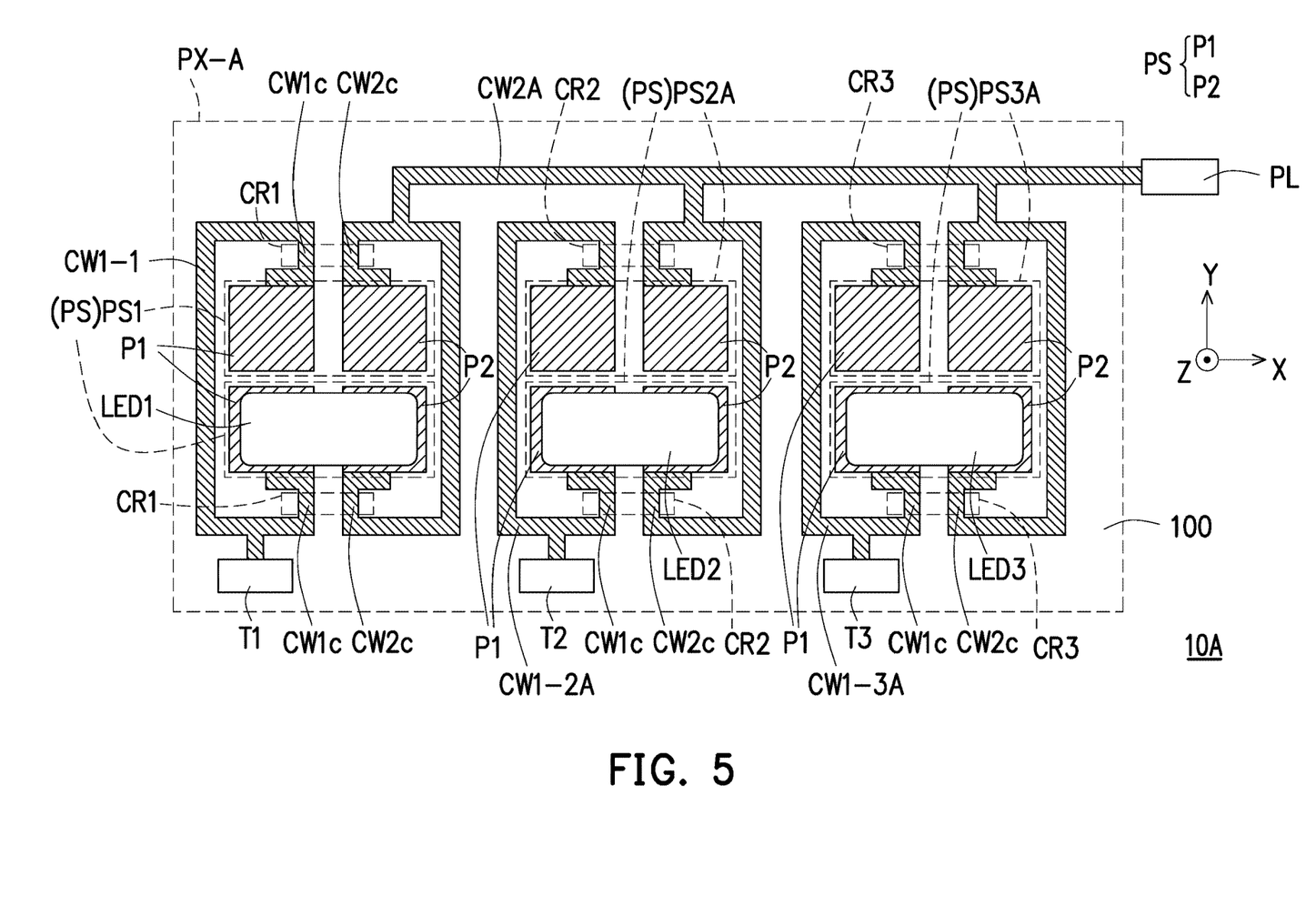
FIG. 5 is a schematic top view of a display panel according to a second embodiment of the disclosure.

FIG. 5 is a schematic top view of a display panel according to a third embodiment of the disclosure. With reference to FIG. 5, the difference between a display panel 10A of this embodiment and the display panel 10 of FIG. 2 lies in that: different numbers of pad sets configured to be bonded to the light-emitting device LED2 and the light-emitting device LED3 in the display pixel are provided. In this embodiment, in a display pixel PX-A, the numbers of pad sets PS configured to be bonded to the light-emitting device LED1, the light-emitting device LED2, and the light-emitting device LED3 are all two. Further, arrangement of two pad sets PS2A configured to be bonded to the light-emitting device LED2 and two pad sets PS3A configured to be bonded to the light-emitting device LED3 is similar to the arrangement of the two pad sets PS1 configured to be bonded to the light-emitting device LED1. Therefore, the related paragraphs of the foregoing embodiments may be referenced, and detailed description is thus not repeated herein.

On the other hand, in this embodiment, cutting regions CR2 are also provided on one side of each of the pad sets PS2A perpendicular to the arrangement direction of the first pads P1 and the second pads P2 thereof. Further, a connecting portion CW1c of a first connecting wire CW1-2A and a connecting portion CW2c of a second connecting wire CW2A connecting the same pad set PS2A are both located in the corresponding cutting regions CR2. Similarly, cutting regions CR3 are also provided on one side of each of the pad sets PS3A perpendicular to the arrangement direction of the first pads P1 and the second pads P2 thereof. Further, the connecting portion CW1c of a first connecting wire CW1-3A and the connecting portion CW2c of the second connecting wire CW2A connecting the same pad set PS3A are both located in the corresponding cutting regions CR3.

The way of repairing the light-emitting device LED2 or the light-emitting device LED3 of this embodiment is similar to that of repairing the light-emitting device LED1 in the display panel 10 of FIG. 2. Therefore, the related paragraphs of the foregoing embodiments may be referenced, and detailed description is thus not repeated herein.

Figure 6:
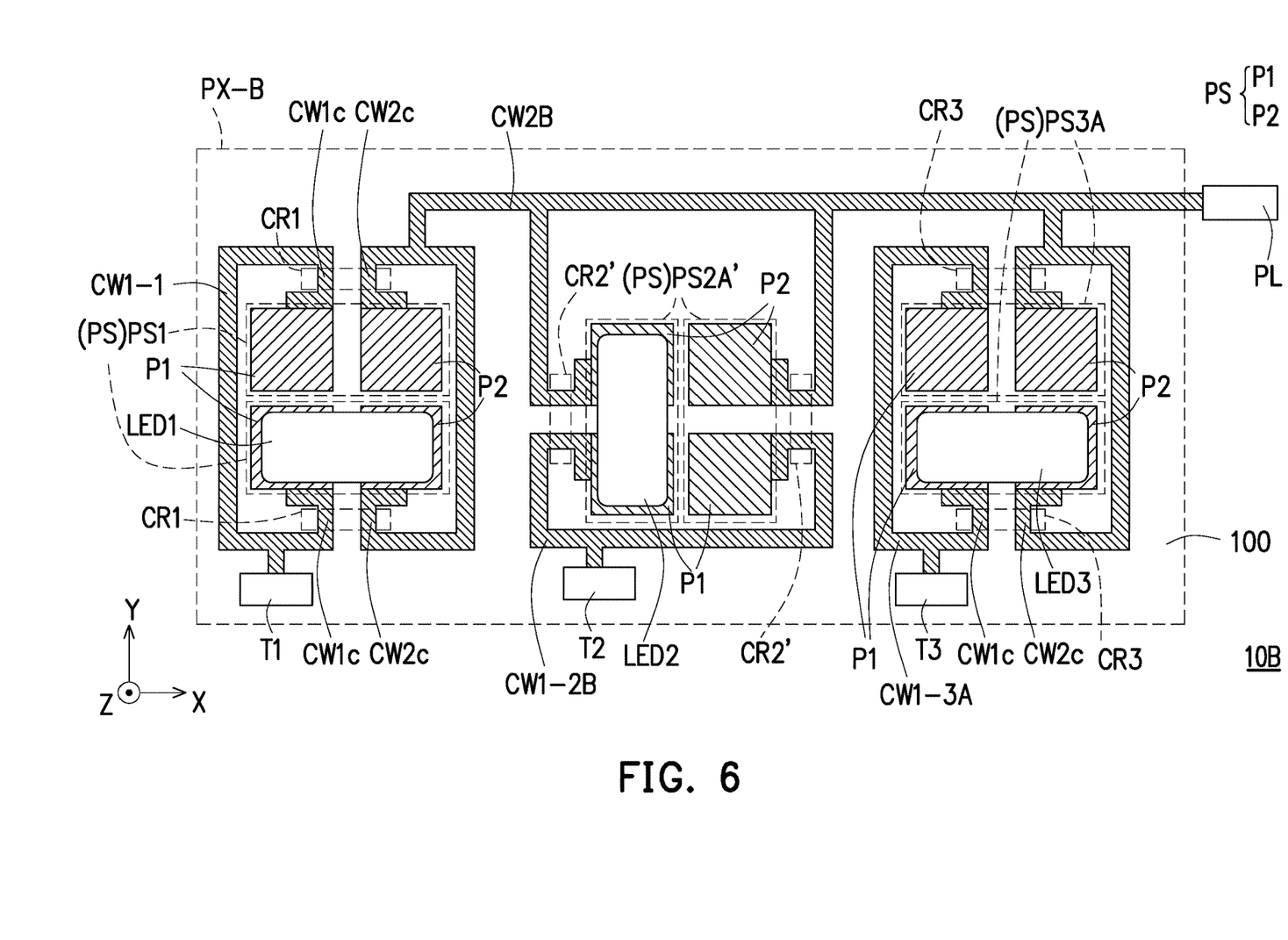
FIG. 6 is a schematic top view of a display panel according to a third embodiment of the disclosure.

FIG. 6 is a schematic top view of a display panel according to a third embodiment of the disclosure. With reference to FIG. 6, the difference between a display panel 10B of this embodiment and the display panel 10A of FIG. 5 lies in that: the arrangement direction of part of the pad sets is different from the arrangement direction of other pad sets. To be specific, in the display panel 10B, the arrangement direction of two pad sets PS2A' of a display pixel PX-B configured to be bonded to the light-emitting device LED2 intersects the arrangement direction of the two pad sets PS1 of the display pixel PX-B configured to be bonded to the light-emitting device LED1 and the arrangement direction of two pad sets PS3A of the display pixel PX-B configured to be bonded to the light-emitting device LED3.

Therefore, the arrangement direction (e.g., direction X) of two cutting regions CR2' disposed on one side of each of the pad sets PS2A' intersects the arrangement direction (e.g., direction Y) of the two cutting regions CR1 disposed on one side of each of the pad sets PS1 and the arrangement direction of the two cutting regions CR3 disposed on one side of each of the pad sets PS3A. The arrangement direction of the two connecting portions CW1c and CW2c of a first connecting wire CW1-2B and a second connecting wire CW2B connecting the same pad set PS2A' also intersects the arrangement direction of the two connecting portions CW1c and CW2c of the first connecting wire CW1-1 and the second connecting wire CW2B connecting the same pad set PS1 and the arrangement direction of the two connecting portions CW1c and CW2c of the first connecting wire CW1-3A and the second connecting wire CW2B connecting the same pad set PS3A.

Figure 7:
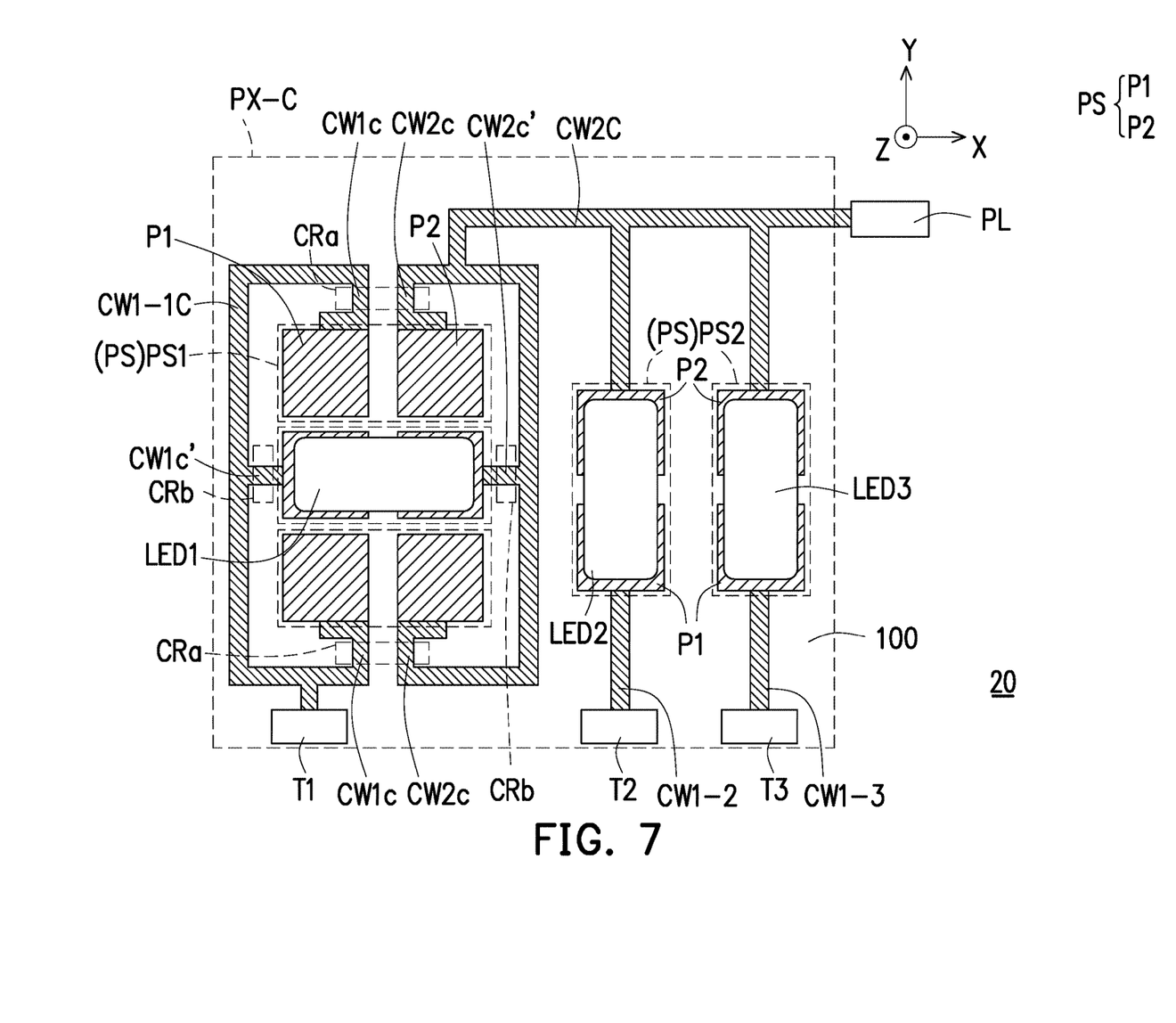
FIG. 7 is a schematic top view of a display panel according to a fourth embodiment of the disclosure.

FIG. 7 is a schematic top view of a display panel according to a fourth embodiment of the disclosure. With reference to FIG. 7, the difference between a display panel 20 of this embodiment and the display panel 10 of FIG. 2 lies in that: the number of pad sets PS1 configured to be bonded to the light-emitting device LED1 in a display pixel PX-C of the display panel 20 is three. That is, the display pixel PX-C of the display panel 20 of this embodiment may repair the light-emitting device LED1 twice.

In this embodiment, the display pixel PX-C includes two cutting regions CRa and two cutting regions CRb. Among the three pad sets PS1, each of the two pad sets PS1 located outside is provided with one cutting region CRa on one side perpendicular to the arrangement direction of the first pad P1 and the second pad P2 thereof, and the two opposite sides of the pad set PS1 located between these two pad sets PS1 are provided with these cutting regions CRb in the arrangement direction of the first pad P1 and the second pad P2 thereof.

Note that a connecting portion CW1c' of the a first connecting wire CW1-1C connecting the middle pad set PS1 and a connecting portion CW2c' of a second connecting wire CW2C connecting the same pad set PS1 are disposed in these two cutting regions CRb. Therefore, after the light-emitting device for repair (e.g., the light-emitting device LEDr1 in FIG. 4) is bonded to the adjacent pad set PS1 provided with one cutting region CRa, the abnormal light-emitting device LED1 originally bonded to the middle pad set PS1 is cut twice. The arrangement of the cutting regions CRa, the first connecting wire CW1-1C, and the second connecting wire CW2C of the display pixel PX-C is similar to the arrangement of the cutting regions CR, the first connecting wire CW1-1, and the second connecting wire CW2 of the display pixel PX in FIG. 2, Therefore, the related paragraphs of the foregoing embodiments may be referenced, and detailed description is thus not repeated herein.

Figure 8:
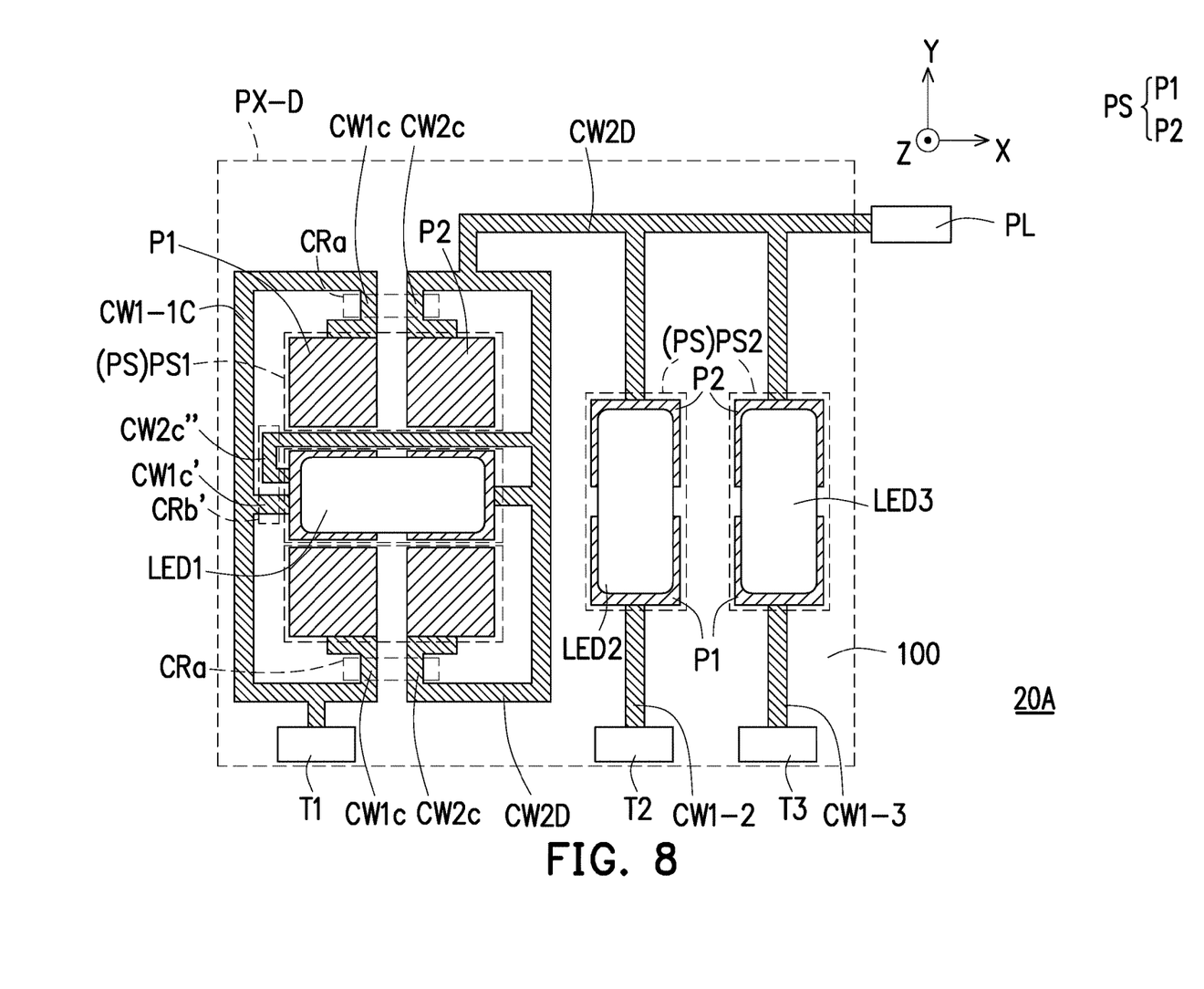
FIG. 8 is a schematic top view of a display panel according to a fifth embodiment of the disclosure.

FIG. 8 is a schematic top view of a display panel according to a fifth embodiment of the disclosure. With reference to FIG. 8, the difference between a display panel 20A of this embodiment and the display panel 20 of FIG. 7 lies in that: the arrangement of the second connecting wire is different, and the number of cutting regions is also different. To be specific, in a display pixel PX-D, a connecting portion CW2c" of a second connecting wire CW2D connecting the middle pad set PS1 and a connecting portion CW1c' of the first connecting wire CW1-1C connecting the same pad set PS1 are disposed in the same cutting region CRb'. That is, after the light-emitting device for repair (e.g., the light-emitting device LEDr1 in FIG. 4) is bonded to the adjacent pad set PS1 provided with one cutting region CRa, the abnormal light-emitting device LED1 originally bonded to the middle pad set PS1 is cut twice. Accordingly, the repair time of the display panel 20A may be greatly shortened, and the repair yield and overall production yield may be improved.

Figure 9:
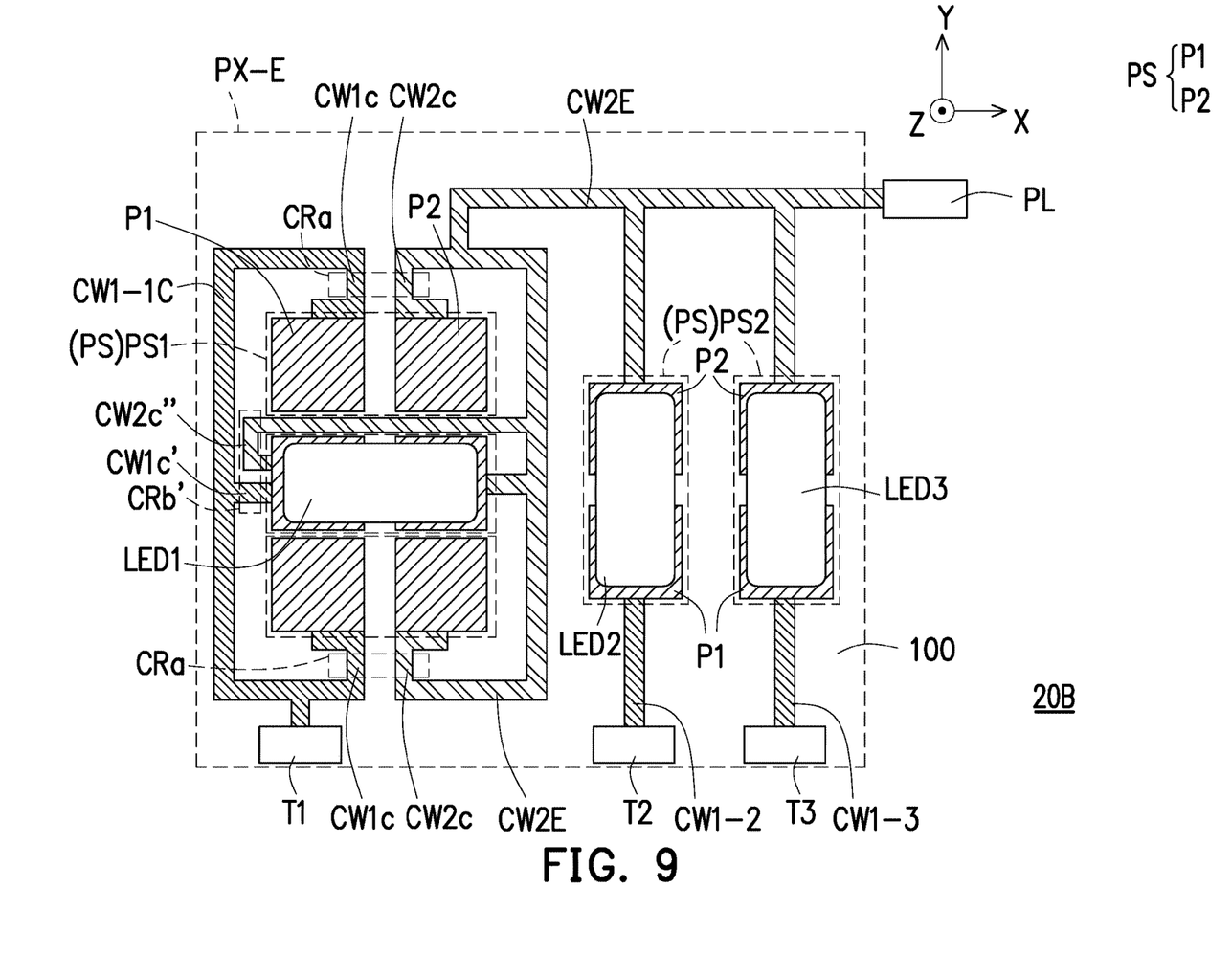
FIG. 9 is a schematic top view of a display panel according to a sixth embodiment of the disclosure.
Figure 10:
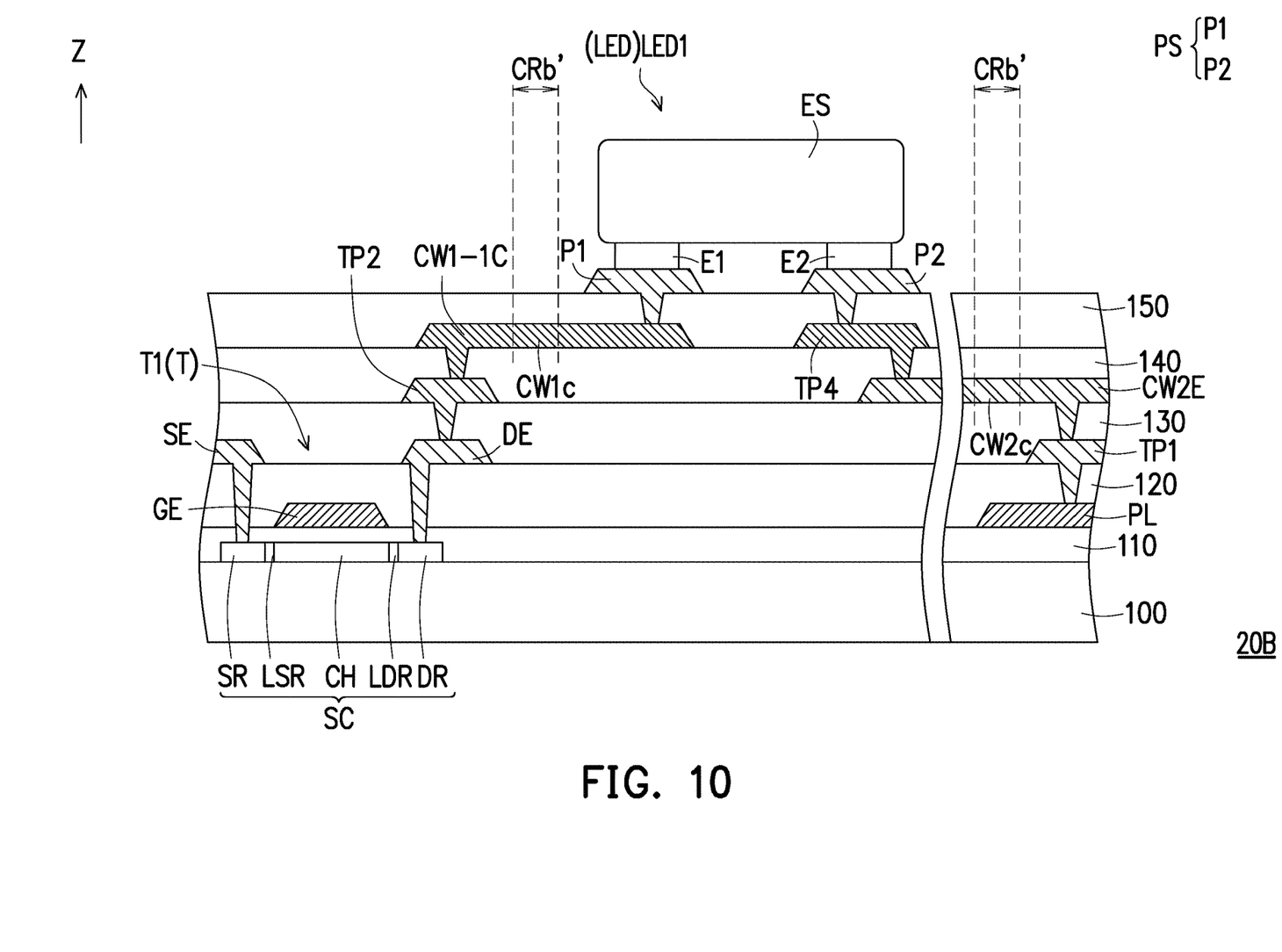
FIG. 10 is a cross-sectional schematic view of the display panel of FIG. 9.

FIG. 9 is a schematic top view of a display panel according to a sixth embodiment of the disclosure. FIG. 10 is a cross-sectional schematic view of the display panel of FIG. 9. With reference to FIG. 9 and FIG. 10, the difference between a display panel 20B of this embodiment and the display panel 20A of FIG. 8 lies in that: the film layer to which the second connecting wire belongs is different. In this embodiment, in a display pixel PX-E, a second connecting wire CW2E and a plurality of first connecting wires may be optionally belong to different film layers. For instance, the second connecting wire CW2E and the transfer pattern TP2 may belong to the same film layer. The second pad P2 of the pad set PS1 is electrically connected to the second connecting wire CW2E through another transfer pattern TP4, and the second connecting wire CW2E is electrically connected to the power line PL through the transfer pattern TP1. Herein, the transfer pattern TP4 and the first connecting wire CW1-1C belong to the same film layer.

Figure 11:
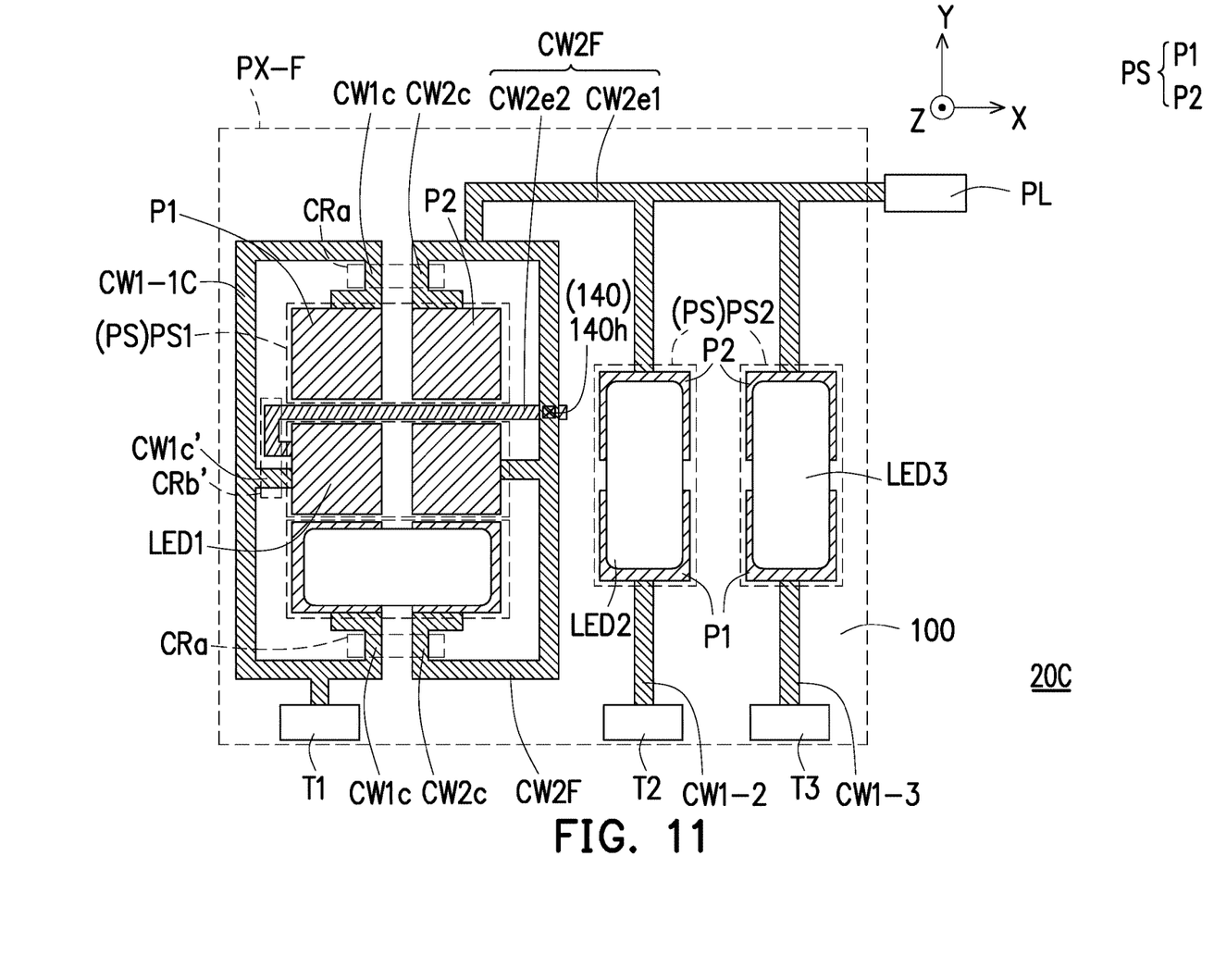
FIG. 11 is a schematic top view of a display panel according to a seventh embodiment of the disclosure.

FIG. 11 is a schematic top view of a display panel according to a seventh embodiment of the disclosure. With reference to FIG. 11, the difference between a display panel 20C of this embodiment and the display panel 20B of FIG. 9 lies in that: the structure forming the second connecting wire is different. In this embodiment, in a display pixel PX-F, a second connecting wire CW2F may include a first extending segment CW2e1 and a second extending segment CW2e2, and the two extending segments belong to different film layers. For instance, the first extending segment CW2e1 of the second connecting wire CW2F and a plurality of first connecting wires may optionally belong to the same film layer, and the second extending segment CW2e2 of the second connecting wire CW2F and the transfer pattern TP2 in FIG. 10 may optionally belong to the same film layer. Herein, the first extending segment CW2e1 is electrically connected to the second extending segment CW2e2 through a contact window 140h of the planarization layer 140. In this way, increased circuit design margin of the display pixels is provided.

In view of the foregoing, in the display panel provided by an embodiment of the disclosure, the first connecting wire and the second connecting wire are respectively connected to the first pad and the second pad of the corresponding pad set through the two connecting portions in the cutting region disposed on one side of the corresponding pad set. As the two connecting portions are disposed in the same cutting region, the repair time of the display panel may be significantly shortened, the repair yield may be increased, and the overall production yield of the display panel may be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
   a substrate; and
   a plurality of display pixels, disposed on the substrate, wherein each of the display pixels comprises:
   a plurality of pad sets, each of the pad sets has a first pad and a second pad;
   a plurality of light-emitting devices, electrically bonded to at least part of the pad sets;
   a first connecting wire, electrically connected to the first pads of a plurality of first pad sets of the pad sets;
   a second connecting wire, electrically connected to the second pads of the pad sets; and
   a plurality of first cutting regions, disposed on one side of each of the first pad sets, wherein two first connecting portions of the first connecting wire and the second connecting wire connecting each of the first pad sets are located in one of the first cutting regions.

2. The display panel according to claim 1, further comprising:
   a plurality of active devices, electrically connected to the first pads of the pad sets, wherein the pad sets comprise:
   a first pad set and a second pad set electrically connected to one of the active devices, a gap between the first pad of the first pad set and the first pad of the second pad set in a first arrangement direction is less than or equal to a gap between the first pad and the second pad in each of the first pad set and the second pad set in a second arrangement direction, and the first arrangement direction intersects the second arrangement direction.

3. The display panel according to claim 1, further comprising:
   a plurality of active devices, electrically connected to the first pads of the pad sets, wherein the pad sets further comprise a plurality of second pad sets, the first pad sets are electrically connected to a first active device of the active devices, the second pad sets are electrically connected to a second active device of the active devices, and a number of the first pad sets is different from a number of the second pad sets.

4. The display panel according to claim 3, wherein the first pad sets are configured to be electrically bonded to at least one first light-emitting device of the light-emitting devices, the second pad sets are configured to be electrically bonded to at least one second light-emitting device of the light-emitting devices, and a light-emitting color of the at least one first light-emitting device is different from a light-emitting color of the at least one second light-emitting device.

5. The display panel according to claim 4, wherein the light-emitting color of the at least one first light-emitting device is red, the light-emitting color of the at least one second light-emitting device is green or blue, and the number of the first pad sets is greater than the number of the second pad sets.

6. The display panel according to claim 4, wherein an arrangement direction of the first pad and the second pad in each of the first pad sets is different from an arrangement direction of the first pad and the second pad in each of the second pad sets.

7. The display panel according to claim 6, further comprising:
   another first connecting wire, electrically connected to the first pads in the second pad sets; and
   a plurality of second cutting regions, disposed on one side of each of the second pad sets, wherein two second connecting portions of the another first connecting wire and the second connecting wire connecting each of the second pad sets are located in one of the second cutting regions, and an arrangement direction of the first cutting regions intersects an arrangement direction of the second cutting regions.

8. The display panel according to claim 1, wherein the light-emitting devices are flip-chip type light-emitting diodes.

9. The display panel according to claim 1, wherein a vertical projection of the first connecting wire on the substrate does not overlap a vertical projection of the second connecting wire on the substrate.

10. The display panel according to claim 1, wherein an arrangement direction of each of the first cutting regions and the corresponding one among the first pad sets intersects an arrangement direction of the first pad and the second pad of the corresponding first pad set.

11. The display panel according to claim 1, wherein the first connecting wire and the second connecting wire belong to different film layers.

* * * * *